United States Patent [19]
Kohno et al.

[11] Patent Number: 5,196,756
[45] Date of Patent: Mar. 23, 1993

[54] STACK-TYPE PIEZOELECTRIC ELEMENT, PROCESS FOR PRODUCING THE SAME, AND STACK-TYPE PIEZOELECTRIC DEVICE

[75] Inventors: Akiomi Kohno; Masatugu Arai, both of Ibaraki; Takeshi Harada, Toride, all of Japan

[73] Assignee: Hitachi Ltd., Tokyo, Japan

[21] Appl. No.: 574,373

[22] Filed: Aug. 29, 1990

Related U.S. Application Data

[63] Continuation of Ser. No. 377,172, Jul. 10, 1989, abandoned.

[30] Foreign Application Priority Data

Jul. 15, 1988 [JP] Japan .................... 63-175050

[51] Int. Cl.⁵ ............................... H01L 41/08
[52] U.S. Cl. ................... 310/328; 310/363; 310/364; 310/358
[58] Field of Search ................. 310/363–366, 310/358, 359

[56] References Cited

U.S. PATENT DOCUMENTS

| 2,497,666 | 2/1950 | Grauley | 310/364 |
| 2,641,718 | 6/1953 | Samuelson | 310/364 X |
| 3,317,762 | 5/1967 | Corwin et al. | 310/364 X |
| 3,573,669 | 4/1971 | Papadakis | 310/334 X |
| 3,590,287 | 6/1971 | Berlincourt | 310/366 |
| 4,477,952 | 10/1984 | Crescenzi et al. | 310/364 X |
| 4,564,782 | 1/1986 | Ogawa | 310/366 X |
| 4,845,399 | 7/1989 | Yasuda et al. | 310/366 |
| 4,848,643 | 7/1989 | Frische et al. | 310/346 X |

FOREIGN PATENT DOCUMENTS

| 0098574 | 6/1984 | Japan | 310/363 |
| 0121784 | 6/1985 | Japan | 310/366 |
| 0128682 | 7/1985 | Japan | 310/366 |
| 0165381 | 7/1987 | Japan | 310/366 |

Primary Examiner—Mark O. Budd

[57] ABSTRACT

According to the present invention, there are provided a stack-type piezoelectric element constructed of a stacked body comprising plural layers of sintered piezoelectric ceramic material and electrodes which lie between the respective layers of the piezoelectric ceramic material, wherein said electrodes are formed of a material capable of diffusion-bonding with said piezoelectric ceramic material at a lower temperature than the sintering temperature of said ceramic material, a process for producing the same, and a stack-type piezoelectric device using said stack-type piezoelectric element.

12 Claims, 2 Drawing Sheets

STACK-TYPE PIEZOELECTRIC ELEMENT, PROCESS FOR PRODUCING THE SAME, AND STACK-TYPE PIEZOELECTRIC DEVICE

This application is a continuation of application Ser. No. 377,172, filed Jul. 10, 1989, now abandoned.

BACKGROUND OF THE INVENTION

The present invention relates to a stack-type piezoelectric element, a process for producing the same, and a device using said element. In particular, it relates to a stack-type piezoelectric element having a high reliability as a piezoelectric actuator, a process for producing the same, and also to a device using said element.

Since a piezoelectric ceramic generates an electric voltage when a force is applied thereto and produces a displacement or a force when voltage is applied thereto, it is highly useful for use as actuators or sensors. When a piezoelectric ceramic is applied to actuators or sensors, it is usually used in the form of a stacked body thereof with electrodes. Such a stacked body is called a stack-type piezoelectric element.

Stack-type piezoelectric elements are produced, like other ceramic laminates, generally by the green sheet method. A piezoelectric ceramic green sheet is a sheet-formed material obtained by calcining the starting material for piezoelectric ceramic, adding to the resulting powder a suitable binder etc. to form a slurry, and then molding the slurry into a sheet. The green sheet thus obtained is printed with a metal paste by means of screen printing or like methods to form an electrode part. A desired number of thus prepared sheets are stacked, dried, and then sintered at one thousand several hundred degrees (Centigrade) to be converted into ceramic. The product thus obtained is the piezoelectric element stacked body of the prior art. For use as the final product, the piezoelectric device is further subjected to lead formation and resin coating and polarization treatment by application of voltage. Such a process for producing stacked bodies using the conventional green sheet method is disclosed, for example, in Japanese Patent Application Kokai (Laid-open) Nos. 60-41273 (1985), 60-91800 (1985) and 60-229380 (1985). A process flow diagram for prior stack-type piezoelectric device is shown in FIG. 3.

In the above-mentioned prior process shown in FIG. 3 the sintering of green sheets and the baking of electrodes are carried out simultaneously, so that it is seemingly a simple process because of relatively small man-hour required. However, the binder etc. present in green sheets is difficult to remove by heating due to obstruction by electrode layers and, if an additional step of removing the binder by heating is taken, the ceramic body is apt to undergo cracking, and destacking deformation.

Furthermore, since the stacked body of green sheets and electrodes is sintered at a high temperature and at one time, and since the contraction of ceramic during sintering is large, a large strain (in other words, internal stress) develops inside the piezoelectric ceramic stacked body. Accordingly, when a high voltage is applied to the stacked body or when it is used repeatedly for a long period, the stacked body undergoes mechanical breakage.

Moreover, a large strain develops also in the polarization treatment conducted after sintering, which also leads to lowering of reliability of strength.

Thus, the stack-type piezoelectric element of the prior art is itself poor in reliability of strength and hence not fully satisfactory for use as actuators etc.

Further, the electrode provided between piezoelectric ceramics, has been conventionally made of silver or silver-palladium (Ag-Pd) alloy. This is because, since the sintering of green sheets of piezoelectric ceramic and the stacking thereof with electrodes are simultaneously effected at about 1300° C., a noble metal stable at high temperature must be used as the electrode material. However, this gives rise to the following problem. That is, water can penetrate into the element through a molding resin protecting the side face of the piezoelectric element, pass through between electrodes, and further form an aqueous layer between the stacked body and the resin. Then, silver is dissolved out as ions (Ag+), which are then attracted by an electric field to accumulate in the vicinity of a neighboring electrode, forming a current-carrying path. In consequence, short circuit of electrodes occurs in the prior art piezoelectric element and device when it is operated in a humid atmosphere. The above-mentioned phenomenon of current-carrying path formation is generally called "migration" and is a serious problem common to electrical parts using electrodes made of silver or silver alloy.

SUMMARY OF THE INVENTION

The stack-type piezoelectric element of the present invention is constructed of a stacked body comprising plural layers of sintered piezoelectric ceramic material and electrodes which lie between the respective layers of the piezoelectric ceramic material, wherein said electrodes are formed of a material capable of diffusion-bonding with said ceramic material at a lower temperature than the sintering temperature of the piezoelectric ceramic material. Examples of the most suitable materials for the electrodes include metallic materials comprising one or more layers of at least one member selected from the group consisting of aluminum and aluminum alloys or one or more layers of at least one member selected from the group consisting of nickel and nickel alloys.

The stack-type piezoelectric device (e.g. actuator and sensor) of the present invention comprises a stacked body formed of plural layers of sintered piezoelectric ceramic material and electrodes which lie between the respective layers of the piezoelectric ceramic material, said respective electrodes being provided such that the positive poles and the negative poles are alternately arranged in the stacking direction, an external lead which connects the positive poles together, and an external lead which connects the negative poles together, both provided at the side of said stacked body, wherein said stacked body is the above-mentioned stack-type piezoelectric element of the present invention.

The process for producing a stack-type piezoelectric element of the present invention comprises stacking sintered piezoelectric ceramic material layers and electrode layers alternately, heating, or heating under applied pressure, the stacked product at a temperature lower than the sintering temperature of the piezoelectric ceramic material and keeping it at the temperature for a predetermined time, thereby to effect bonding, preferably diffusion bonding.

DETAILED DESCRIPTION OF THE INVENTION

Figure 1:
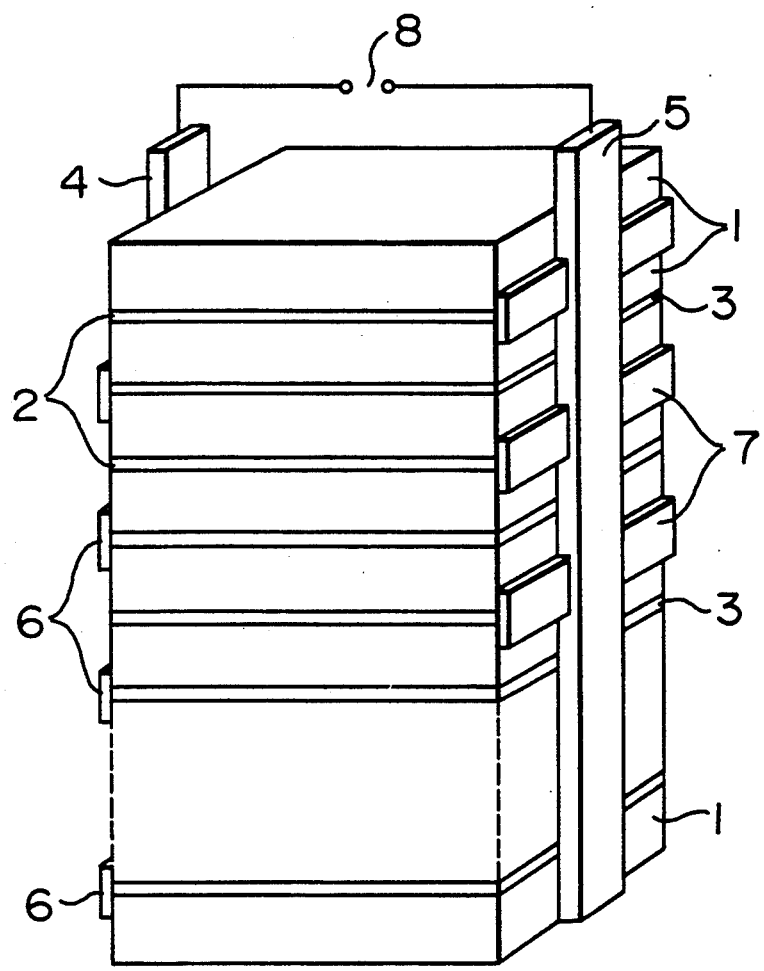
FIG. 1 is a perspective view of a stack-type piezoelectric device of one embodiment of the present invention.

The "sintered piezoelectric ceramic" referred to in the invention is the product obtained by sintering a piezoelectric ceramic green sheet.

The piezoelectric element according to the present invention is preferably cooled after the bonding step without removal of applied pressure. Particularly in the cooling process conducted after the bonding step, the piezoelectric ceramic is desirably subjected to a polarization treatment by applying a voltage thereto at a higher temperature by 20°-70° C. than the Curie point of the ceramic. The "Curie point" referred to herein is a temperature at which the piezoelectric ceramic loses its characteristic property, and the "polarization treatment" is a step of treatment of ceramic for converting it into a piezoelectric device.

In general, a piezoelectric ceramic material is a ferromagnetic material having a perovskite-type crystal structure. At a higher temperature than the Curie point the ceramic material exists as a crystalline phase of the cubic system, but at a lower temperature than the Curie point it assumes a crystalline phase deformed from the cubic system, which results in development of dislocation, in other words polarity (or orientation), in crystal structure. A piezoelectric ceramic immediately after sintering is an aggregate of crystal grains and the respective crystal grain comprises parts of different polarities mingled with one another. In a piezoelectric ceramic which has been subjected to sintering alone, the sum of polarity vectors is zero for respective crystal grains and the ceramic is nonpolar as a whole. When a predetermined electric field is applied thereto, the direction of polarity is determined for respective crystal grains. This phenomenon is termed polarization and such a treatment is termed the polarization treatment.

The electrode material may be used in any of the forms of film, foil and paste. Preferred conventional materials are pure aluminum, aluminum alloys, nickel and nickel alloys. When an aluminum electrode is used, it is preferably of a three-layer structure wherein the both skin materials are aluminum-silicon alloy and the core material is aluminum. The material employed for a nickel electrode is nickel used alone or a nickel alloy or, particularly preferably, a solid solution of nickel with either chromium, phosphorus, or a compound thereof. A particularly preferable nickel electrode material has a structure comprising a nickel core material and nickel alloy skin materials formed on the both sides thereof. When aluminum alloy of a three-layer structure is used as the electrode material, the diffusion bonding temperature is 580°-660° C. In forming a stacked body by application of heat and pressure, at a diffusion bonding temperature of 580°-660° C., only the skin layers of the electrode become liquid, so that the oxide film on the aluminum alloy electrode surface is broken and the liquid phase of the active aluminum alloy acts to enhance the bonding reaction with the piezoelectric ceramic. On the other hand, aluminum of the core material remains solid and keeps a fixed electrode thickness. In the case of nickel alloy of a three-layer structure, the diffusion bonding temperature is 875°-1200° C.

The stacking form is not restricted to a planar stacking and may be a cylindrical stacking.

In the present invention, since piezoelectric ceramic layers sintered already are stacked, no contraction due to sintering occurs during the stacking; in other words, since the piezoelectric ceramic has already undergone contraction there is no possibility for a strain to remain in the stacked body.

Further, since application of heat, or heat and pressure, is effected at a temperature lower than the sintering temperature, the piezoelectric ceramic and the electrode metal are diffusion-bonded with each other strongly and with low thermal strain, so that the bonding strength at the interface is higher and improved in reliability as compared with the prior art. In particular, strain due to contraction caused by cooling from high temperature and by sintering is small and correspondingly thermal stress developed is also small. Sintering of the piezoelectric ceramic is carried out at 1200°-1300° C. and diffusion bonding at 580°-1200° C. (lower than the sintering temperature). Furthermore, the stack-type piezoelectric element of the present invention is less susceptible to migration and hence has a lower probability of causing a current-carrying phenomenon.

Polarization causes the piezoelectric ceramic itself to increase its volume and to develop a large internal stress. Therefore, when the polarization treatment is applied in the course of cooling, volume contraction due to cooling and volume increase due to polarization are compensated, leading to relaxation of internal strain (or internal stress) and resultant improvement in strength reliability of the piezoelectric ceramic.

When aluminum, aluminum alloy, nickel, or nickel alloy is used as the electrode metal, the stacking temperature (namely bonding temperature) can be greatly lowered, so that little thermal stress is developed. Moreover, since aluminum is an active metal, the bonding property of an electrode with the piezoelectric ceramic is improved.

Thus, according to the process of the present invention, the internal strain (or internal stress) developed during the steps of producing a piezoelectric element is small and the strength reliability is markedly improved.

Furthermore, in the present invention the insert material used for bonding the piezoelectric ceramic layers with each other serves also as an electrode material, so that the production process is simple.

DESCRIPTION OF THE PREFERRED EMBODIMENTS

Example

Figure 2:
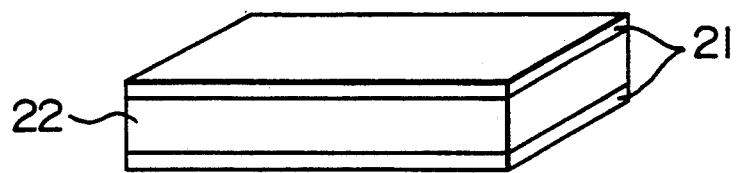
FIG. 2 is a perspective view of an electrode layer used in another embodiment of the present invention.
Figure 3:
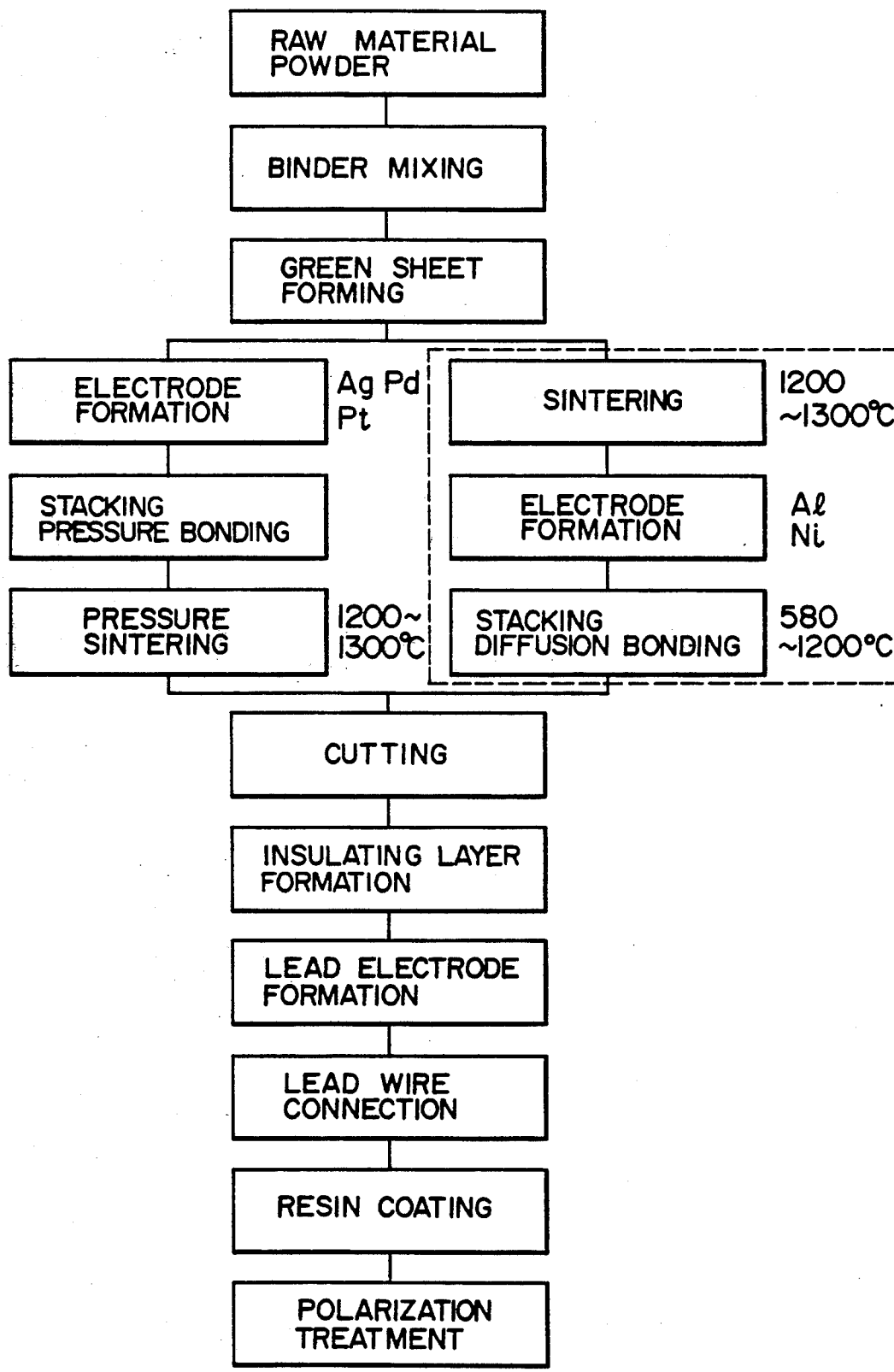
FIG. 3 is a process flow diagram for producing a stack-type piezoelectric device and here the main description of the invention is enclosed by a broken line.

A perspective view of a stack-type piezoelectric device according to one embodiment of the present invention is shown in FIG. 1. A perspective view of one example of an electrode part is shown in FIG. 2. A process flow diagram for producing a stack-type piezoelectric device is shown in FIG. 3.

A solid solution (PZT) powder composed of approximately equal amounts of lead zirconate ($PbZrO_3$) and lead titanate ($PbTiO_3$) is made up into a slurry and formed into a green sheet. As shown in process enclosed by a broken line in FIG. 3, the sheet is sintered to obtain a piezoelectric ceramic layer 1. Between the respective layers of a plurality of the piezoelectric ceramic layers 1, are alternately arranged electrode layers 2 and 3, and heat and pressure are applied thereto to obtain a stacked body. A preferred embodiment of the respective electrode layers 2 and 3 has a structure as shown in FIG. 2, wherein aluminum-silicon alloy skin materials 21 are formed on the both sides of an aluminum core material 22.

When the electrode has the above-mentioned structure, since at a bonding temperature of 580°–660° C. only the skin layer turns into a liquid phase, the oxide film on the aluminum electrode surface is broken at the time of above liquefaction, and the resulting active aluminum liquid phase acts to enhance the bonding and reaction with the piezoelectric ceramic. On the other hand, aluminum of the core material remains solid, making it possible to secure a fixed electrode thickness. Thus, when there is no core material and the whole of an aluminum electrode turns into a liquid phase, an outflow of liquid aluminum to the outside of the bonding interface will occur, and an electrode of a fixed thickness is not obtained. Further, in an electrode structure in which liquefaction of a part of the electrode does not occur, the oxide film ($Al_2O_3$) on the surface greatly inhibits bonding. Accordingly, the use of an aluminum electrode having such a three-layer structure wherein the surface layer alone turns into a liquid phase makes it possible to improve the bonding property with piezoelectric ceramic and to obtain a fixed electrode thickness.

When a nickel alloy electrode shown in FIG. 2 is used, the diffusion bonding temperature is 875°–1200° C.

The respective piezoelectric ceramic layers are desirably as thin as possible. The thickness is preferably 0.1 mm or less. Electrode layers 2 are collectively connected to an external lead 4, while electrode layers 3 are collectively connected to an external lead 5. The electrode layer 2 and the external lead 5 are insulated from each other with an insulating material 7, while the electrode layers 3 and the external lead 4 are insulated with an insulating material 6. The external leads 4 and 5 are connected to an electric terminal 8.

EXAMPLE 1

As shown in FIG. 1, piezoelectric ceramic layers 1 (20 mm in diameter and 0.1 mm in thickness) sintered already and pure aluminum electrode foils 2 and 3 (20 mm in diameter and respectively 10 μm in thickness) were alternately stacked in 120 layers to form a stacked body. The stacked body was placed in a bonding furnace and the interior of the furnace was evacuated to a vacuum of the order of $10^{-4}$ Torr. Then, a pressure of 1.0 kg/mm$^2$ was applied to the stacked body and the body was heated to 630° C. and kept at this condition for 30 minutes. Thereafter, it was cooled down to room temperature at the rate of 2° C./min. Resultantly, it was confirmed that the piezoelectric ceramic and the aluminum electrode had been chemically bonded strongly.

The stack-type device was subjected to a fatigue test conducted by means of a predetermined high-strength electric field driving. Resultantly, it was found that whereas the product of the prior art was broken in $10^7$ times, the product of the present Example was not broken until $10^8$–$10^9$ times, and thus a product of prolonged life could be obtained.

EXAMPLE 2

In place of the pure aluminum electrode used in Example 1, there was used an electrode foil (10 μm in thickness) comprising an aluminum core material 22 and aluminum-silicon alloy skin materials 21 clad on the both sides thereof. The electrode layers 2 and 3 and piezoelectric ceramic layers 1 sintered already are alternately stacked in 120 layers, and heat and pressure were applied thereto in the same manner as in Example 1. In the present Example, the bonding temperature was 585° C., bonding pressure 0.2 kg/mm$^2$ and bonding time 30 minutes. At 585° C., only the aluminum-silicon alloy skin material 21 of the electrode is molten through an aluminum-silicon eutectic reaction, forming a liquid phase at the bonding interface. Resultantly, the oxide film formed on the both surfaces of the aluminum alloy electrode is broken by melting, an active aluminum surface is exposed, and the reaction between aluminum and piezoelectric ceramic is promoted. On the other hand, since the aluminum core material 22 remains solid, the thickness of the aluminum electrode after bonding is kept constant. In the fatigue test of stack-type piezoelectric elements thus prepared, no device was found to break in 109 times, which revealed that a piezoelectric element and device having a reliability still higher than that in Example 1 could be obtained.

EXAMPLE 3

Piezoelectric ceramic layers sintered already and aluminum foil electrodes having a three-layer structure shown in FIG. 2 were alternately stacked in 120 layers, then heated under vacuum at 585° C. while a pressure of 0.2 kg/mm$^2$ was being applied thereto, and kept at this condition for 30 minutes to effect bonding.

After the bonding, the stacked body was cooled at a cooling rate of 2° C./min down to 335° C. while maintaining the applied pressure. It was then cooled down to room temperature, during which a constant polarity pulse voltage of 400 V was applied to respective piezoelectric ceramic sheets. After cooling down to room temperature, the polarization voltage and applied pressure were removed. Thus, a polarization treatment was applied in the course of cooling succeeding to bonding. The stack-type piezoelectric device thus obtained had a fatigue characteristic superior to that in Examples 1 and 2, showing a fatigue life of $10^{11}$ times or more.

Though an electrode foil was used in the above-described examples of preparation of a stack-type piezoelectric element, it is also possible to provide thin film electrodes between respective piezoelectric ceramic layers by other means including vapor deposition, ion plating, and sputtering.

According to the above Examples 1–3, piezoelectric ceramic layers sintered already can be bonded at low temperature to form a stacked body. Consequently, the strain due to contraction of ceramic in sintering can be prevented from developing. Further, the thermal stress caused by cooling from high temperature can be reduced. Moreover, since the polarization treatment is applied in the course of cooling subsequent to bonding, the internal strain developed in the polarization treatment can be reduced.

In the above Examples, such additional measures may be taken as improving the water permeability of molding resin covering the outermost layer of the piezoelectric element to prevent infiltration of water, or covering it completely with a metal cover. Examples of suitable molding resins include epoxy resin (which is in common use for molding semiconductor elements) used alone or incorporated with phenol-novolak resin as a curing accelerator, silicone rubber as a flexibility-imparting agent, or silica or alumina powder as a filler for improving strength; polyimide resin and fluorocarbon resin.

As described above, the present invention can provide an effect of greatly improving the strength reliability of a stack-type piezoelectric element.

What is claimed:

1. A stack-type piezoelectric element constructed of a stacked body comprising plural layers of sintered piezoelectric ceramic material and electrodes which lie between and bond by diffusion the respective layers of the piezoelectric ceramic material, wherein said respective electrodes each comprises an aluminum core between a pair of aluminum alloy skins, and wherein said aluminum alloy is capable of diffusion-bonding with said ceramic material at a temperature lower than the sintering temperature of the piezoelectric ceramic material.

2. A stack-type piezoelectric element according to claim 1, wherein said pair of aluminum alloy skins are made of an aluminum silicon alloy.

3. A stack-type piezoelectric element, constructed of a stacked body comprising plural layers of sintered piezoelectric ceramic material and electrodes which lie between and bond by diffusion the respective layers of the piezoelectric ceramic material, wherein said respective electrodes each comprises a nickel core between a pair of nickel alloy skins, and wherein said nickel alloy is capable of diffusion-bonding with said ceramic material at a temperature lower than the sintering temperature of the piezoelectric ceramic material.

4. A stack-type piezoelectric element prepared by a process comprising:
   sintering a plurality of piezoelectric ceramic green sheets for form sintered piezoelectric ceramic sheets;
   stacking said plurality of sintered piezoelectric ceramic sheets with respective electrodes between adjacent ones of said plurality of sintered piezoelectric ceramic sheets to form a stack, said respective electrodes being formed of a metallic material, wherein said metallic material is one or more layers of at least one member selected from aluminum and an aluminum alloy or one or more layers of at least one member selected from nickel and a nickel alloy, and wherein said metallic material is capable of diffusion-bonding with said sintered piezoelectric ceramic sheets at a temperature lower than a sintering temperature of said piezoelectric ceramic green sheets; and
   heating said stack to a temperature lower than said sintering temperature to diffusion bond said plurality of piezoelectric ceramic sheets with said metallic material.

5. A stack-type piezoelectric device comprising a stacked body formed of plural layers of sintered piezoelectric ceramic material and electrodes which lie between the respective layers of the piezoelectric ceramic material, said respective electrodes being provided such that the positive poles and the negative poles are alternately arranged in the stacking direction, an external lead which connects the positive poles together, and an external lead which connects the negative poles together, both provided at the side of said stacked body, wherein said stacked body is a stack-type piezoelectric element according to claim 4.

6. A stack-type piezoelectric element according to claim 4, wherein said piezoelectric green sheets are each made from a slurry comprising lead zirconate and lead titanate.

7. A stack-type piezoelectric element according to claim 4, wherein each of said respective electrodes comprises an aluminum core between a pair of aluminum alloy skins.

8. A stack-type piezoelectric element according to claim 4, wherein each of said pair of aluminum alloy skins is made of an aluminum silicon alloy.

9. A stack-type piezoelectric element according to claim 4, wherein each of said respective electrodes comprises a nickel core between a pair of nickel alloy skins.

10. A stack-type piezoelectric element according to claim 4, wherein each of said respective electrodes is made of aluminum.

11. A stack-type piezoelectric element according to claim 4, wherein each of said respective electrodes is made of nickel.

12. A stack-type piezoelectric element constructed of a stacked body comprising plural layers of sintered piezoelectric ceramic material and electrodes which lie between and bond by diffusion the respective layers of the piezoelectric ceramic material, wherein each of said respective electrodes is made of nickel, and wherein said nickel is capable of diffusion-bonding with said ceramic material at a temperature lower than the sintering temperature of the piezoelectric ceramic material.

* * * * *